(12) United States Patent
Entwistle (10) Patent No.: US 10,636,334 B2
(45) Date of Patent: Apr. 28, 2020

(54) MEDIA WALL

(71) Applicant: Michael Entwistle, St. Albans (GB)

(72) Inventor: Michael Entwistle, St. Albans (GB)

(73) Assignee: CCOMM Group Ltd., St. Albans, Hertfordshire (GB)

(*) Notice: Subject to any disclaimer, the term of this patent is extended or adjusted under 35 U.S.C. 154(b) by 0 days.

(21) Appl. No.: 15/990,655

(22) Filed: May 27, 2018

(65) Prior Publication Data

US 2018/0350277 A1 Dec. 6, 2018

(30) Foreign Application Priority Data

Jun. 2, 2017 (GB) .................................. 1708790.9

(51) Int. Cl.
*G09F 9/302* (2006.01)
*F16M 13/02* (2006.01)
(Continued)

(52) U.S. Cl.
CPC .............. *G09F 9/3026* (2013.01); *E04B 2/74* (2013.01); *F16M 13/022* (2013.01);
(Continued)

(58) Field of Classification Search
CPC ........ G09F 9/3026; H05K 7/14; H05K 7/023; H05K 5/0204; H05K 5/0017; F16M 13/022; E04B 2/74; E04B 2002/7468; H04N 5/64
See application file for complete search history.

(56) References Cited

U.S. PATENT DOCUMENTS 5,024,030 A * 6/1991 Morrison ............. A47B 83/001
  52/36.1
5,746,035 A   5/1998 Seiber et al.
(Continued)

FOREIGN PATENT DOCUMENTS

| WO | 9743495 A1 | 11/1997 |
| WO | 9829623 A1 | 7/1998 |
| WO | 2007012196 A1 | 2/2007 |

OTHER PUBLICATIONS

Extended European Search Report for European Patent Application No. 18173338.7, dated Oct. 25, 2018, 9 pages.
(Continued)

*Primary Examiner* — Rockshana D Chowdhury
(74) *Attorney, Agent, or Firm* — Withrow & Terranova, P.L.L.C.

(57) ABSTRACT

According to the present invention there is provided a media wall comprising a vertical frame arranged to be anchored to one or more of a floor, wall or ceiling, one or more display panels and a plurality of decorative panels, wherein the frame comprises a plurality of uprights and a plurality of display panel cross members suspended by the uprights, by which the one or more display panels are supported and a plurality of decorative panel cross members suspended form the uprights, by which the plurality of display panels are supported, wherein the decorative panel cross members are of a different type to the display panel cross members. The invention provides a media wall which can be relatively easily and inexpensively tailored and assembled to a customer's specific requirements and permits the media wall to be easily disassembled, possibly reconfigured and reassembled either at the same or a different location.

17 Claims, 8 Drawing Sheets

(51) Int. Cl.
*H05K 5/00* (2006.01)
*H05K 7/02* (2006.01)
*H05K 7/14* (2006.01)
*E04B 2/74* (2006.01)
*H05K 5/02* (2006.01)
*H04N 5/64* (2006.01)

(52) U.S. Cl.
CPC ......... *H05K 5/0017* (2013.01); *H05K 5/0204* (2013.01); *H05K 7/023* (2013.01); *H05K 7/14* (2013.01); *E04B 2002/7468* (2013.01); *H04N 5/64* (2013.01)

(56) References Cited

U.S. PATENT DOCUMENTS

| | | | |
|---|---|---|---|
| 5,826,385 A | 10/1998 | Dykstra et al. | |
| 6,230,445 B1 * | 5/2001 | Arko | E04B 2/7416 211/90.02 |
| 6,311,441 B1 * | 11/2001 | Beavers | E04B 2/7422 52/220.7 |
| 8,033,759 B2 * | 10/2011 | Davidsaver | E02B 3/06 405/284 |
| 2011/0197519 A1 | 8/2011 | Henriott et al. | |
| 2012/0251072 A1 * | 10/2012 | Cope | G09F 21/04 386/230 |

OTHER PUBLICATIONS

Search Report for United Kingdom Patent Application No. GB1708790.9, dated Nov. 23, 2017, 5 pages.

* cited by examiner

MEDIA WALL

CROSS-REFERENCE TO RELATED APPLICATION(S)

This application claims priority to United Kingdom Patent Application No. 1708790.9 filed on Jun. 2, 2017, wherein the entire contents of the foregoing application are hereby incorporated by reference herein.

TECHNICAL FIELD

The present invention relates to a media wall of the type comprising one or more displays units in a housing, which housing will typically extend to the floor and may also extend to either the ceiling, adjacent side walls of a room or both, such as to create a false wall within the room. The invention, according to a second aspect, also provides a method of constructing such a media wall.

BACKGROUND

Media walls presently often comprise a number of display units located adjacent to one another and controlled such that their combined displays form a single image. The display units and any associated electronic equipment normally require a substantial framework to be constructed, in which the display units and any associated electronic units are housed.

Displays of the above type are normally relatively expensive and may typically be found in prestigious applications, such as a conference room in a headquarters building for example. It is for this reason that such displays are normally housed in a casing, which both hides the framework, any associated electronics units and the cabling, resulting in the display appearing as part of an aesthetically pleasing wall.

Media walls can be particularly aesthetically pleasing if they extend across a complete wall of a room, such that the display units appear to be embedded in the wall, whereas the media wall is actually built in front of the existing wall of a building. The media wall will typically comprise a heavy metal framework of a significant depth in order to accommodate the display units and any associated electronic equipment, which framework will normally be essentially free standing and supported by the floor, although it will likely be tied to the wall for stability. Quite often such a media wall will be spaced away from the wall of a room in order to provide access to the rear of the display wall, in case any electronic component in the wall should fail and need to be replaced or serviced. Thus, when a media wall of the above type is installed this is normally a relatively large project, with the media wall being constructed, possibly off site initially, for a specific application, with it then taking a significant time to build it on site, where many components will have to be cut or adjusted to the specific requirements of the room in which it is to be installed.

More recently software directed particularly to media wall applications is making the media wall a potentially very important tool, particularly for example in businesses that are geographically distributed. If media walls are widely available in such a business, then they may not only enable groups of employees at a number of locations to effectively all attend a common meeting via respective media walls, but the media walls may also enable a host of features to be brought to such a meeting, or to a meeting only involving the attendees in a single room. The significance of this is that there is a need for media walls which, although still aesthetically pleasing, are significantly less expensive to construct and install so that they can be made more widely available.

SUMMARY

According to the present invention there is provided a media wall comprising a vertical frame arranged to be anchored to one or more of a floor, wall or ceiling, one or more display panels and a plurality of decorative panels, characterised in that the frame comprises a plurality of uprights and a plurality of display panel cross members suspended by the uprights, by which the one or more display panels are supported and a plurality of decorative panel cross members suspended form the uprights, by which the plurality of display panels are supported, wherein the decorative panel cross members are of a different type to the display panel cross members.

The term decorative panels, as used in the context of the present application, is to be interpreted to encompass any panel the primary function of which is to provide an overall aesthetically pleasing appearance. Specifically, the term is to encompass plain panels without pattern or ornament.

A media wall in accordance with the present invention may be relatively simple to construct on site and may be constructed from many standard components. Particularly, the provision of cross members to support the decorative panels which are different to the cross members to support the display panels, may enable the decorative panel cross members to be relatively light weight and to be arranged to enable the decorative panels to be easily mounted to them.

Preferably each and every upright of the frame is arranged in a single linear array of uprights. By arranging the uprights in this manner so that they all lie in a single plane, the overall depth of the media wall may be greatly reduced, especially if the display panels are generally what are referred to as flat screen display panels.

Advantageously all the uprights are equally spaced relative to each other and more preferably the uprights alone support all the other components of the media wall. In this manner only a single array of uprights need to be attached in any way to the structure of a room in which the media wall is to be installed. Typically the uprights may be fixed at their lower ends to a plate to be secured (if necessary) to the floor and additionally only secured at their upper ends to the ceiling or an upper portion of the wall of the room. In both cases this may be above the level of any false ceiling in the room. In this way the weight of the media wall is carried by the floor and only a minimal of fixing needs to be established between the media wall and the wall or ceiling of the room. Thus where a media wall comprises a plurality of easily assembled components, the media wall in accordance with the invention may be very quickly and easily installed within a room, with a minimum of disruption to the functioning of the building in which the room is located. Furthermore, as the fabric of the room is only visibly affected to a minimal extent, or possibly not at all where a false ceiling is present, this enables the wall to be removed without effecting the fabric of the room, or effecting it only to a minimal extent, making such a media wall far more flexible in enabling it to be relatively easily relocated should this be desirable.

Preferably: each decorative panel comprises a ferromagnetic rear face and decorative front face; the decorative panel cross members are extruded and have a number of channels running along their length; the media wall further comprising a plurality of fixings arranged to engage in the channels and to slide along the channels to a desired location; and each fixing comprising a magnet arranged to engage with a rear face of a decorative panel. This enables the panels to be easily and correctly positioned on the frame and once the fixings have been correctly positioned, enables the decorative panels to be subsequently attached and removed without the use of tools. This not only makes it relatively easy and quick to initially assemble the decorative panels, but this also ensures easy subsequent access to the inside of the media wall, should this be necessary.

Each decorative panel may have at least one location device arranged to engage with a location device on a respective decorative panel, to correctly locate that decorative panel on the frame.

Each decorative panel may comprise a rear ferromagnetic tray like backing member comprising a forward planar section with three or more edges extending rearwards to increase the rigidity of the planar section, each decorative panel further comprising a decorative facing member bonded or adhered to a front face of the forward planar section. In this manner the backing member may provide a surface to which the magnets can attach and also provide the strength required to ensure the decorative panels are sufficiently rigid so as not to distort. Furthermore, the facing member hides any blemishes that may occur in the backing member as a result of the attachment of the location pins or the bending of the edges to form the rearward extending edges to increase the rigidity of the decorative panel.

Each decorative panel may be rectangular, with each tray like backing member having no more than three edges extending rearwards from the forward planar section, with a first rearward extending edge joining both a second and third rearward extending edges and extending rearwards to a maximum extent along its length, with the second and third rearward extending edges extending rearwards to a maximum extent where they join with the first rearward extending edge, but which second and third rearward extending edges taper off towards an edge of the backing member opposite to the first edge. This may provide sufficient rigidity to the panel while saving weight relative to a backing member which had four rearwardly extending edges, each extending along their entire length to a maximum extent, The decorative facing members may be non-ferromagnetic and may, for example, be planar aluminum panels that extend over the whole of the planar forward section of the respective backing member. Where the decorative facing members are of a lighter color than the backing members only the facing members will be detected by the eye and thus will appear as an aesthetically pleasing layer of panels extending over the media wall. Preferably the display panels and decorative panels cover the entire external face of the media wall.

Preferably the media comprises a plurality of identical decorative panels which are interchangeable on the frame, enabling standardisation of the decorative panels and enabling many of the same standard decorative panels to be used to construct different sizes and shapes of media walls, depending on a customer's requirements.

The media wall may comprise at least one display panel, a plurality of planar decorative panels and a plurality of decorative corner panels, each decorative corner panel forming both part of the front face of the media wall and a return edge of the media wall, which return edge encloses a side of the media wall. In this way the media wall may be totally enclosed by the decorative panels, even where the media wall does not extend to adjacent side walls of a room.

According to a second aspect of the invention there is provided a method of constructing a media wall as described above, the method comprising, in no particular order, the steps of:
  selecting a number of display panels;
  selecting a number of standard sized decorative panels;
  selecting or cutting an appropriate number of display panel cross members of an appropriate length for the selected display panels;
  selecting or cutting an appropriate number of uprights of an appropriate length;
  selecting or cutting an appropriate number of decorative panels extruded cross members of an appropriate length;
  selecting an appropriate number of magnetic fixings and engaging them in the decorative panel cross members;
  securing the uprights in position in a building as a single linear array;
  mounting the display panel cross members to the uprights to form a frame supported entirely by the uprights;
  mounting the display panels centrally in the frame on the display panel cross members;
  securing the decorative panel cross members to the uprights;
  selecting an appropriate number of magnetic fixings and fixing them in channels in the decorative panel cross members; and
  securing the decorative panels to the magnetic fixings.

The above method enables a media wall to be quickly assembled on site from many standard and interchangeable components. The method may further comprise securing a plurality of identical decorative panels on a front face of the media wall by means of a plurality of identical magnetic fixings and securing a plurality of identical corner decorative panels by means of other magnetic fixings identical to those securing the decorative panels of the front face. This permits easy subsequent removal and reattachment of the decorative panels, should this become necessary.

DETAILED DESCRIPTION

One embodiment of the present invention will now be described, by way of example only, with reference to the accompanying drawings.

Figure 1:
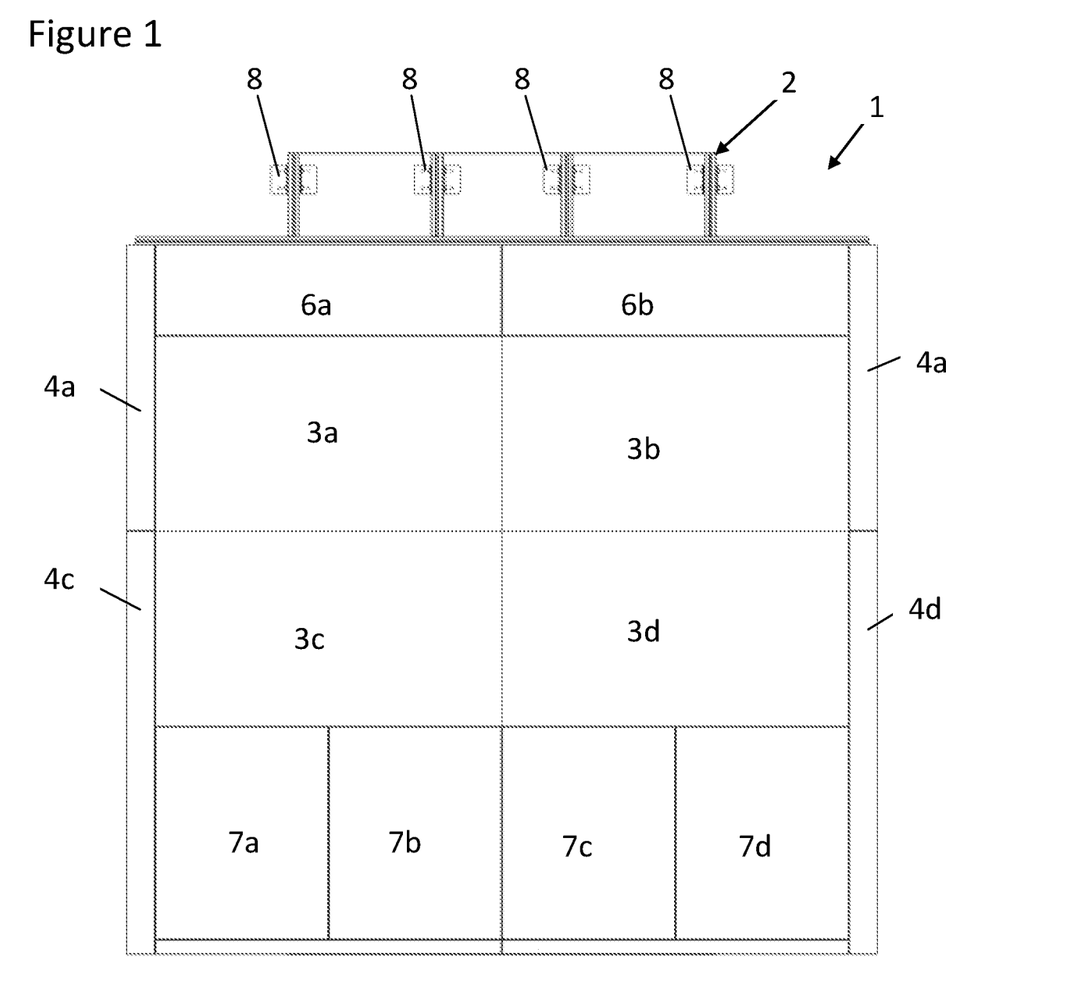
FIG. 1 is a front view of a media wall in accordance with the present invention.
Figure 2:
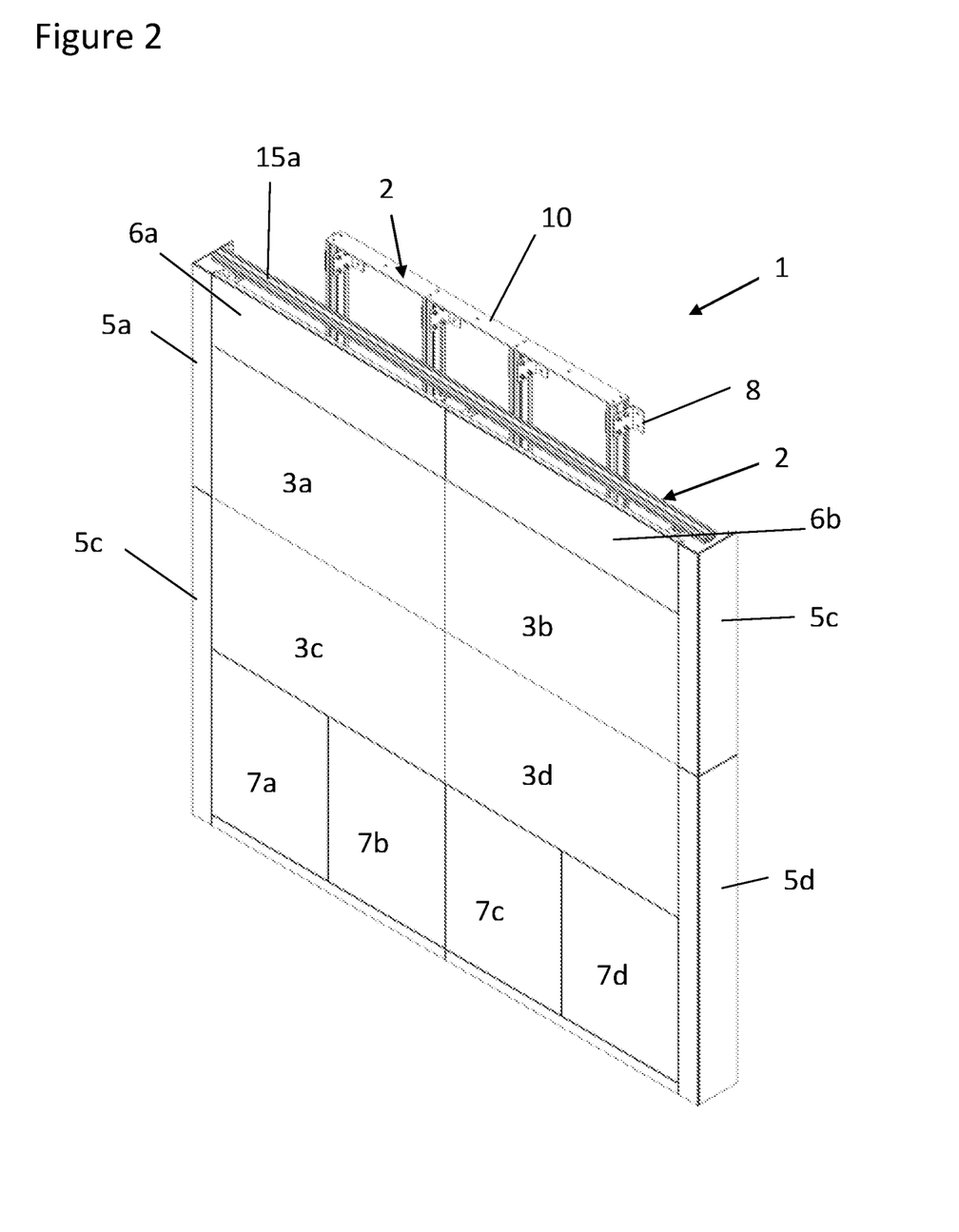
FIG. 2 is a front perspective view of the media wall of FIG. 1.

Referring now to FIGS. 1 and 2, these show a media wall, indicated generally as 1, in accordance with the present invention. This comprises a frame, indicated generally as 2 (which is described in more detail with reference to FIGS. 3 and 4) and, in this embodiment, four flat screen display panels 3a to 3d, which may for example be commercially available off the shelf flat screen plasma or LCD display panels. The media wall 1 further comprises four corner decorative panels 4a, 4b, 5a and 5b and six planar decorative panels 6a, 6b and 7a to 7d.

The media wall of FIGS. 1 and 2 is arranged to be supported entirely by the frame 2 and is arranged to be secured to a wall of a building by means of brackets 8, wherein the height of the main body of the display (ignoring the frame) extends to the height of a suspended ceiling, with the frame 2 (shown here) arranged to be anchored to the wall above the height of the suspended ceiling by means of the brackets 8. However, where a suspended ceiling is not present, the frame need only extend to the same height as the main body of the media wall. In either case the frame could be attached at its upper end to a ceiling (or structure above a suspended ceiling) instead of to a wall, enabling it to be freestanding away from any wall, if this should be desired.

As can be most clearly seen from FIG. 2 the corner decorative panels 4a, 4b, 5a and 5b form returns down the side of the media wall, which returns will abut the wall of the building and thereby enclose the media wall, providing a particularly aesthetically pleasing appearance.

As will be appreciated from FIGS. 1 and 2, with an appropriately sized frame any number of display panels may be incorporated into the media wall, with an appropriate number of additional planar decorative panels 6a, 6b and 7a to 7d. Certain ones of the decorative panels, such as 4a to 7d, may all be standard sizes. However, selected ones of the decorative panels, such as the upper corner decorative panels 4a and 4b and upper planar decorative panels 6a and 6b, may be tailor made to specific requirements, if for example it is required that the media wall 1 extend precisely from the floor to an existing ceiling. Similarly additional planar decorative panels may be used if a wider media wall is required, for example if it is to extend between two existing walls. Here the width of the corner decorative panels 4a to 5b may need to be tailored to a specific requirement, or the corner panels may be omitted and the planar panels extend to the adjacent walls of a room instead. However, a particularly advantage of the present invention is that the use of corner decorative panels enables the media wall to be fitted to the wall of a building without requiring it to extend right across the width of a room, thus minimising the cost for a given area of display panels and reducing or eliminating the requirement for tailor made decorative panels.

Figure 3:
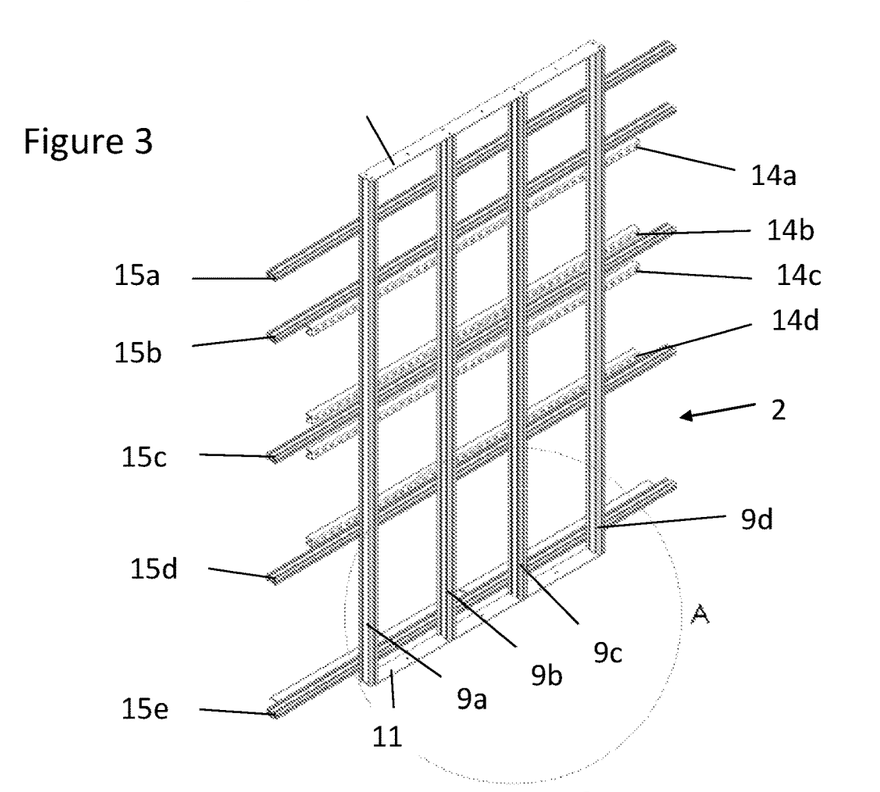
FIG. 3 is a rear perspective view of a frame of the media wall of FIGS. 1 and 2.
Figure 4:
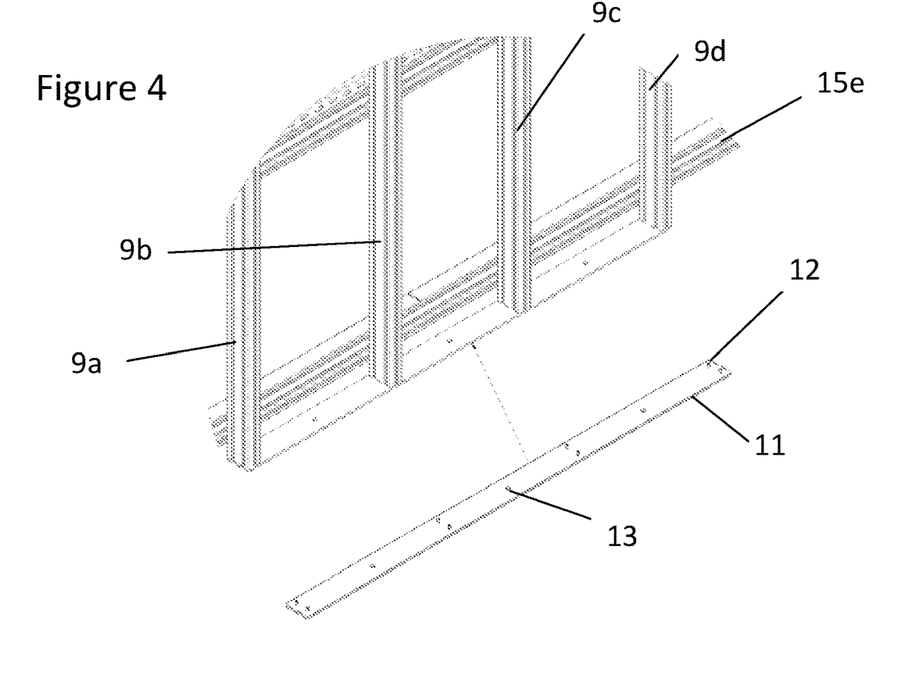
FIG. 4 shows to an enlarged scale the section "A" of FIG. 3.

Referring now to FIGS. 3 and 4, these show the frame 2, seen in FIGS. 1 and 2. The frame 2 comprises four uprights 9a to 9d equidistantly spaced from each other in a linear array by end plates 10 and 11. The uprights are formed from identical length of extruded aluminum, each having a number of channels on each side. Into the end of the channels fixings (not shown) may be secured through holes 12 in the end plates 10 and 11 (see FIG. 4) to ensure the uprights 9a to 9d are equally spaced and parallel to each other. The end plates 11 and 12 may be cut to length depending on the number of uprights 9a to 9d required, which in turn will be dependent on the number and width of the display units 3a to 3d. The end plates 10 and 11 have further holes 13 midway between the upright positions, through which holes 13 further fixings (not shown) may be used to secure the base of the frame to a floor and if appropriate to a ceiling of a building, instead of, or in addition to, the brackets 8 shown in FIGS. 1 and 2.

To the uprights 9a to 9d there are secured by fixings (not shown) display panel cross members 14a to 14d, for supporting the display panels 3a to 3d. Again these may be cut to any desired length depending on the width and number of display panels 3a to 3d. Also attached to the uprights 9a to 9d are decorative panel cross members 15a to 15e, to which the decorative panels 4a to 7d are to be attached by fixings, described below with reference to FIGS. 5 and 6.

Each of the decorative panel cross members 5a to 15e may again be cut or selected to be an appropriate length and these are also formed from extruded aluminum and have a number of channels extending along their length.

Figure 5:
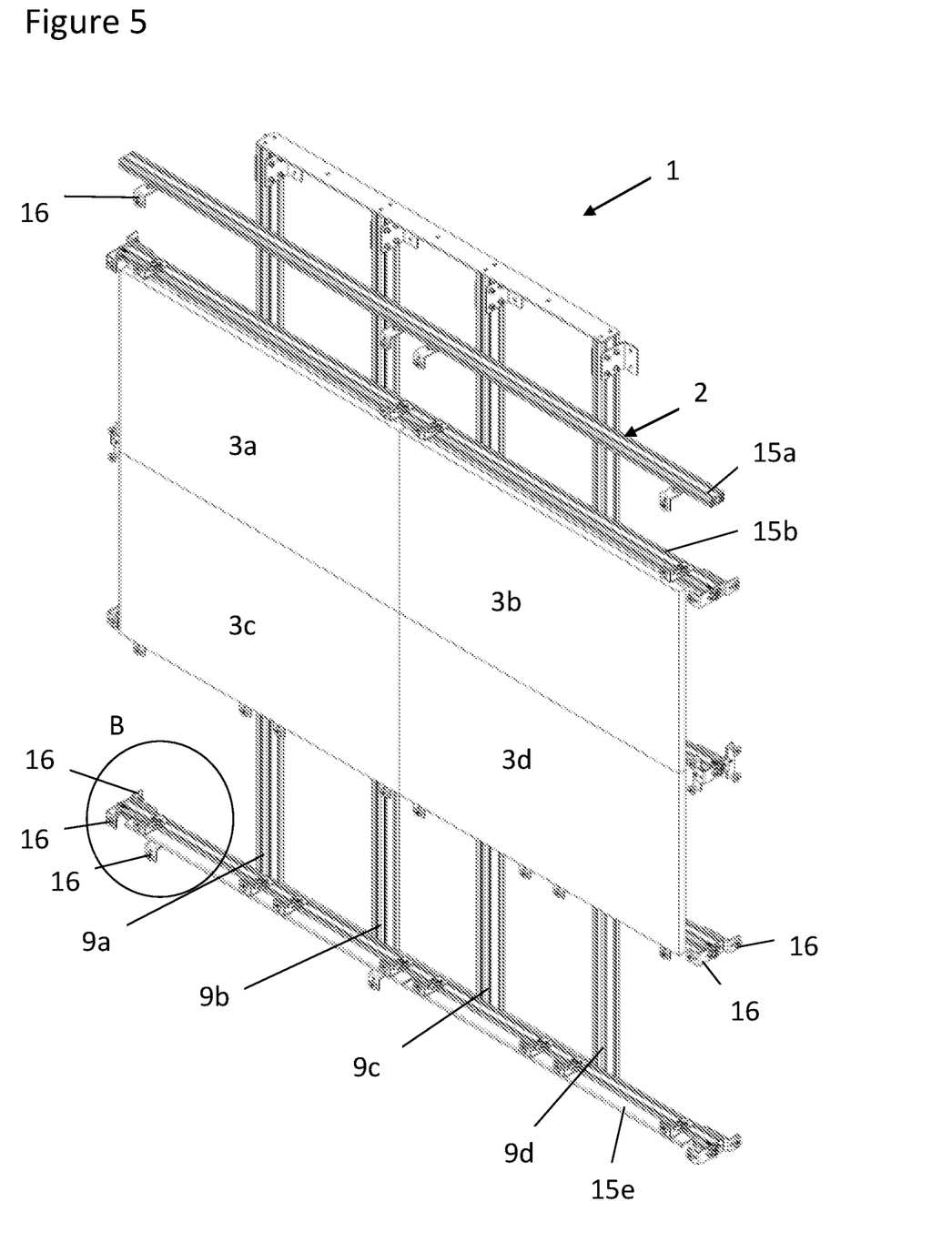
FIG. 5 is a front perspective view of the frame of FIG. 3 with a number of fixings and four display panels attached thereto.

Referring now to FIG. 5, this is a front perspective view of the frame of FIGS. 3 and 4, but with the decorative panels 3a to 3d attached to the display panel cross members 14a to 14d in a conventional manner. Additionally, a number of magnetic fixings 16 have been secured at appropriate locations on the decorative panel cross members 15a to 15e and four of these are shown in greater detail in FIG. 6, which is an enlargement of the inset "B" of FIG. 5.

Figure 6:
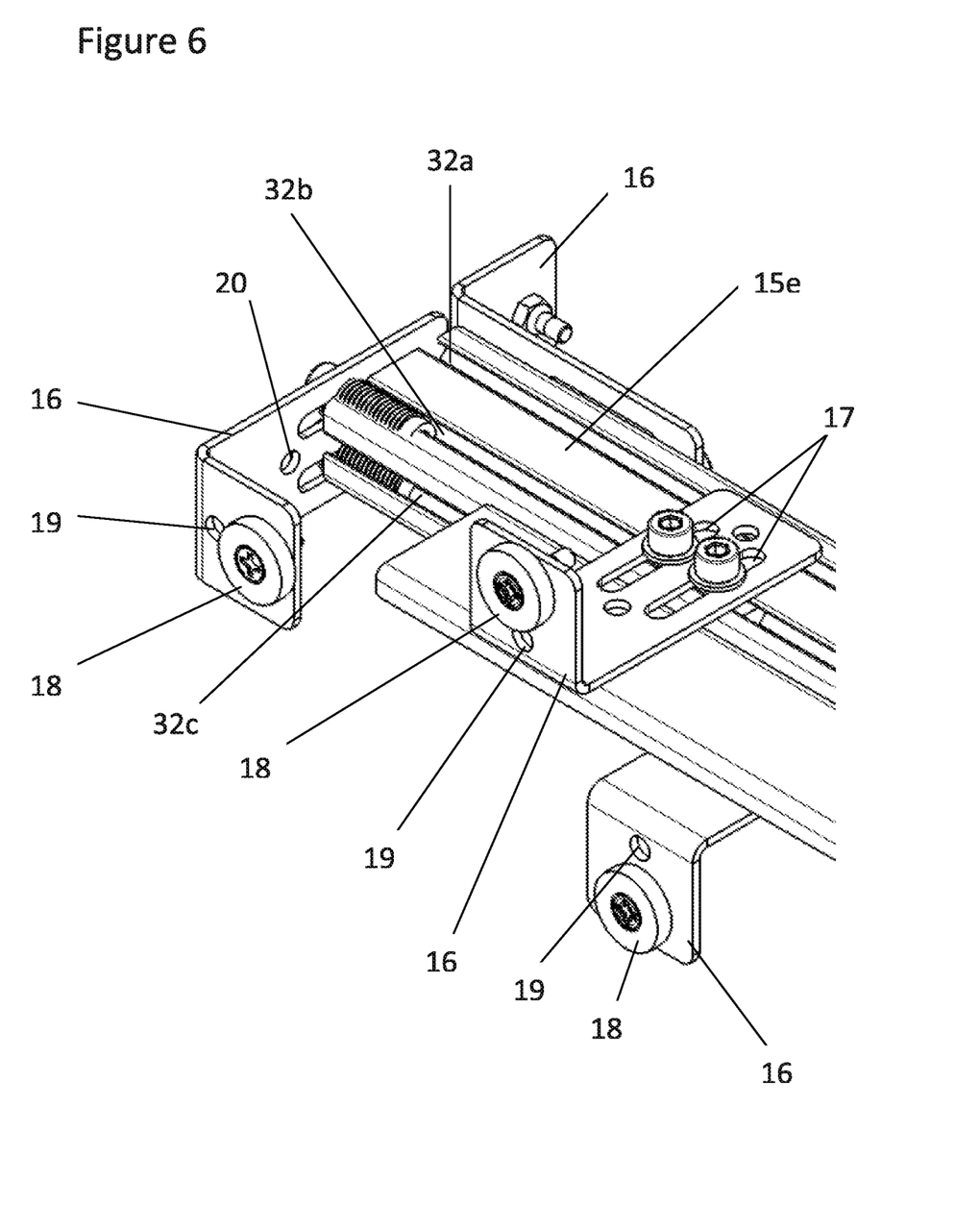
FIG. 6 shows to an enlarged scale the section "B" of FIG. 5.

From FIG. 6 it is seen that each of the magnetic fixings 16 is secured to the channels 32a-32c extruded in the decorative panel cross member 15e. Each magnetic fixing 16 comprises a right angled plate, as shown, with a pair of slots 17 therein which, together with the extruded channels 32a-32c in the decorative panel cross member 15e, permit the position of the magnetic fixing 16 to be both set to a required front to back depth and also in the correct lateral position along the decorative panel cross member 15e.

On a front face of each magnetic fixing 16 is a magnet 18, arranged to engage with a respective decorative panel, as will be described below with reference to FIGS. 7 to 11. Additionally, each magnetic fixing 16 also comprises location holes 19 and 20 to receive respective location pins 21 (described below) mounted on the back of the decorative panels 4a to 7d.

Figure 7:
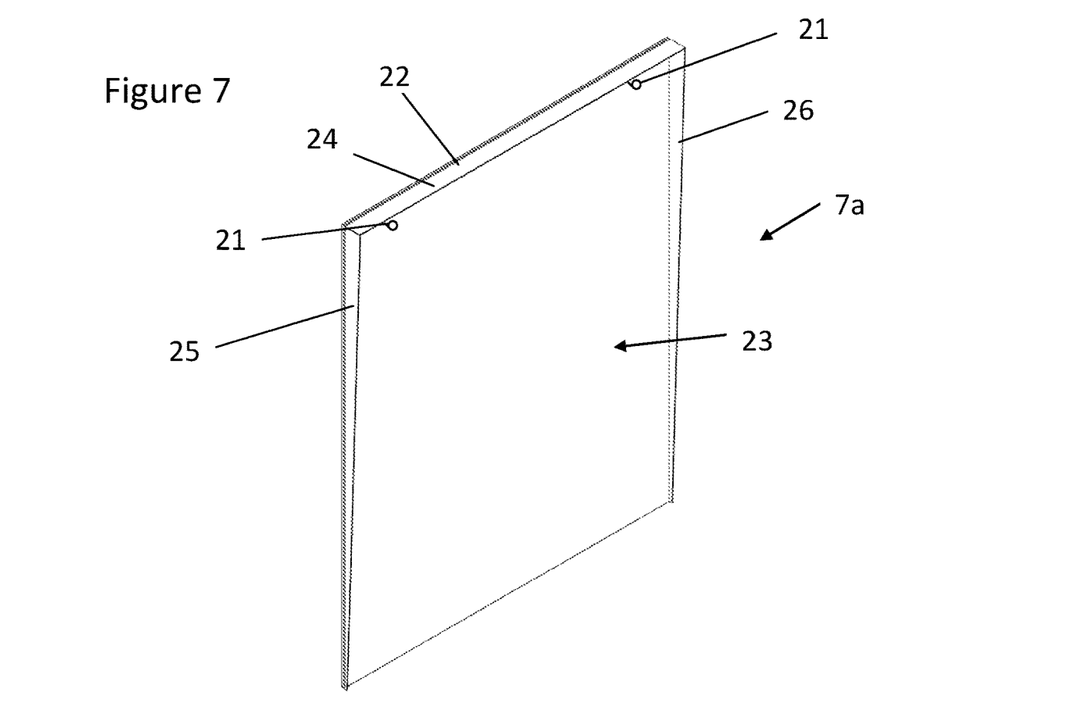
FIG. 7 is a rear perspective view of one of the planar decorative panel of the media wall of FIGS. 1 and 2.
Figure 8:
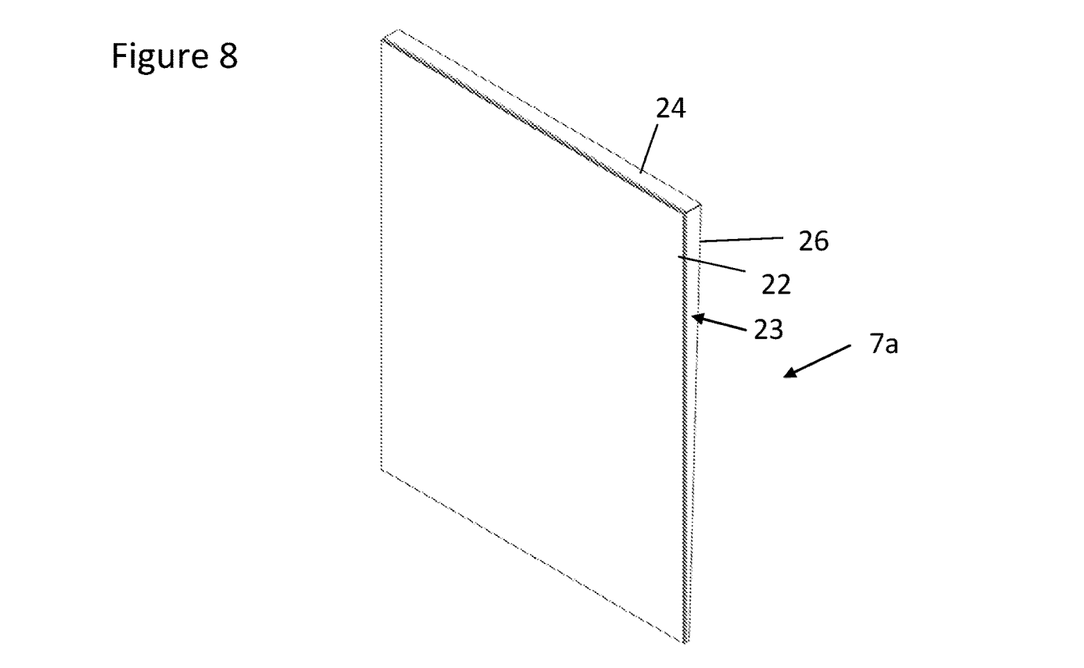
FIG. 8 is a front perspective view of the decorative panel of FIG. 7.
Figure 9:
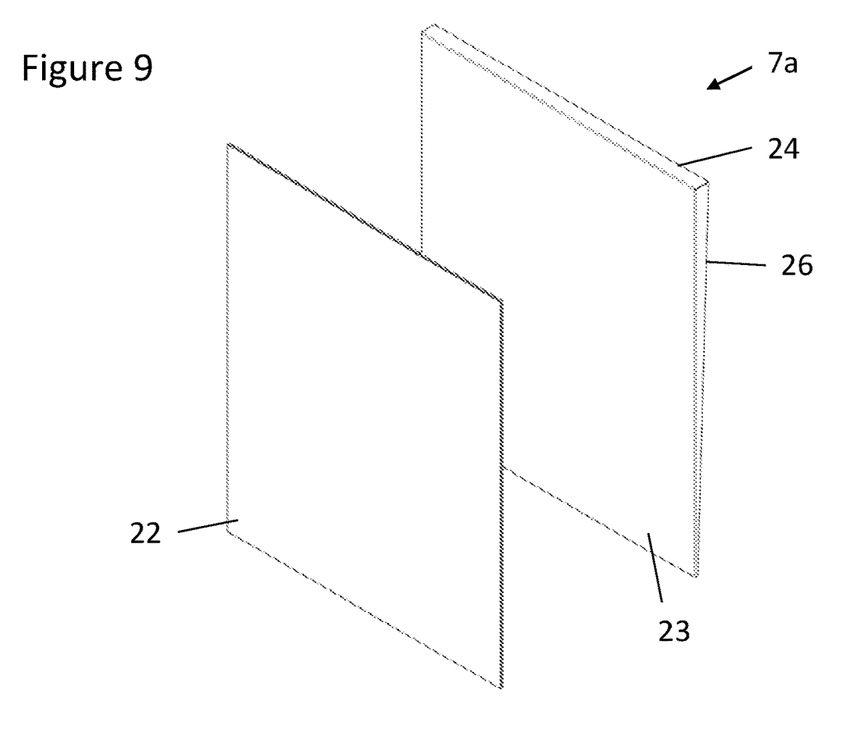
FIG. 9 is a front perspective view of the decorative panel of FIGS. 7 and 8, but showing the two components of the decorative panel separated.
Figure 10:
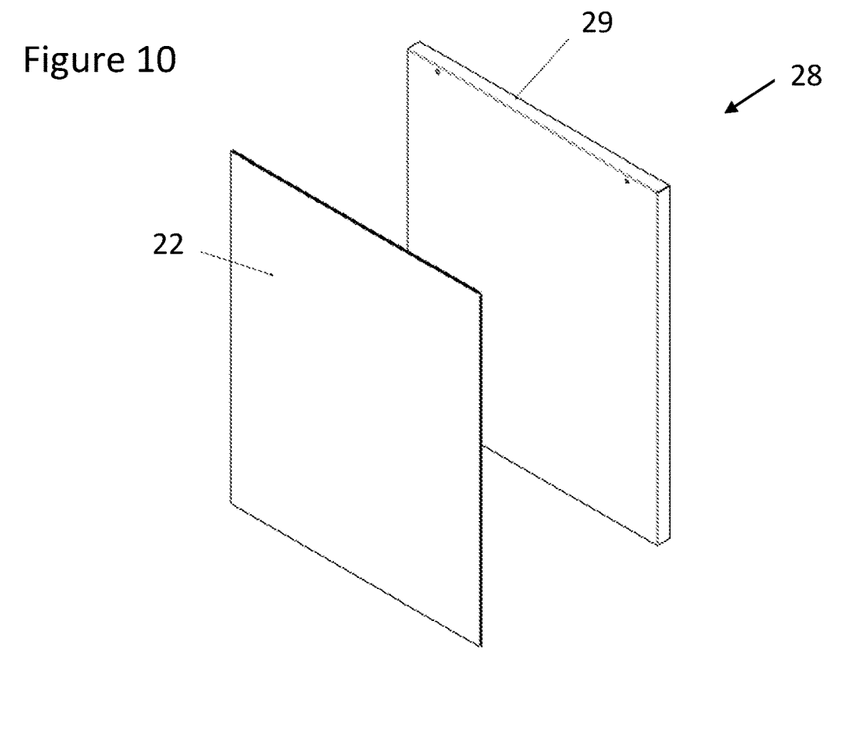
FIG. 10 is a view similar to that of FIG. 9, but showing an alternative planar decorative panel with a different backing member.

Referring now to the FIGS. 7 and 8, these are respectively rear and front perspective views of the planar decorative panel 7a of FIG. 1, identical to planar decorative panels 7b to 7d of FIG. 1. As shown most clearly in FIG. 9, the decorative panel 7a comprises a flat decorative facing member 22, which may for example be an aluminum sheet with machined edges and which may be anodised or painted to provide a particularly crisp appearance. The facing member 22 is bonded or adhered to a pressed steel tray like backing member 23, which is shaped to provide lateral rigidity by having a rearwardly extending top edge 24 and to provide vertical rigidity by having two rearwardly extending side edges 25 and 26. As shown, the side edges 25 and 26 taper away and there is no rearwardly extending bottom edge. This is because, in this embodiment, the top edge 24 and two tapered side edges 25 and 26 provide sufficient rigidity for this particular application. The side edges are tapered as shown and the bottom edge omitted to reduce the weight of the backing member 23 and thus the weight of the decorative panel 7a. However, an alternative backing member 29 is illustrated in FIG. 10, with four complete edges to provide a more rigid decorative panel 28, should this be desired.

Referring again now to FIG. 7, on the back of each steel backing member 23 are two location pins 21, which engage with location holes 19 in respective magnetic fixings 16. As will be appreciated from FIG. 4, each planar decorative panel 6a to 7b will be secured in place by the action of the magnets 18 of four respective magnetic fixings 16, attaching to the steel backing members 23 of the planar decorative panels 6a to 7d.

Figure 11:
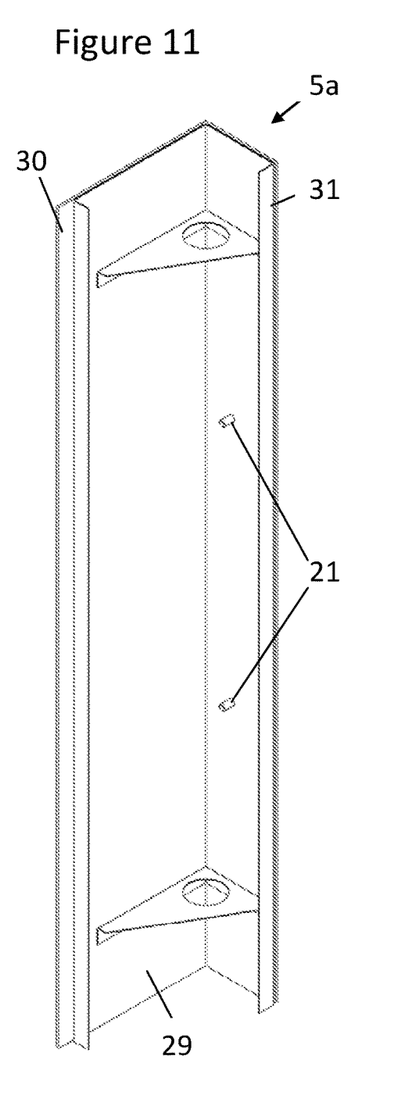
FIG. 11 is a rear perspective view of a corner decorative panel of the media wall of FIGS. 1 and 2.
Figure 12:
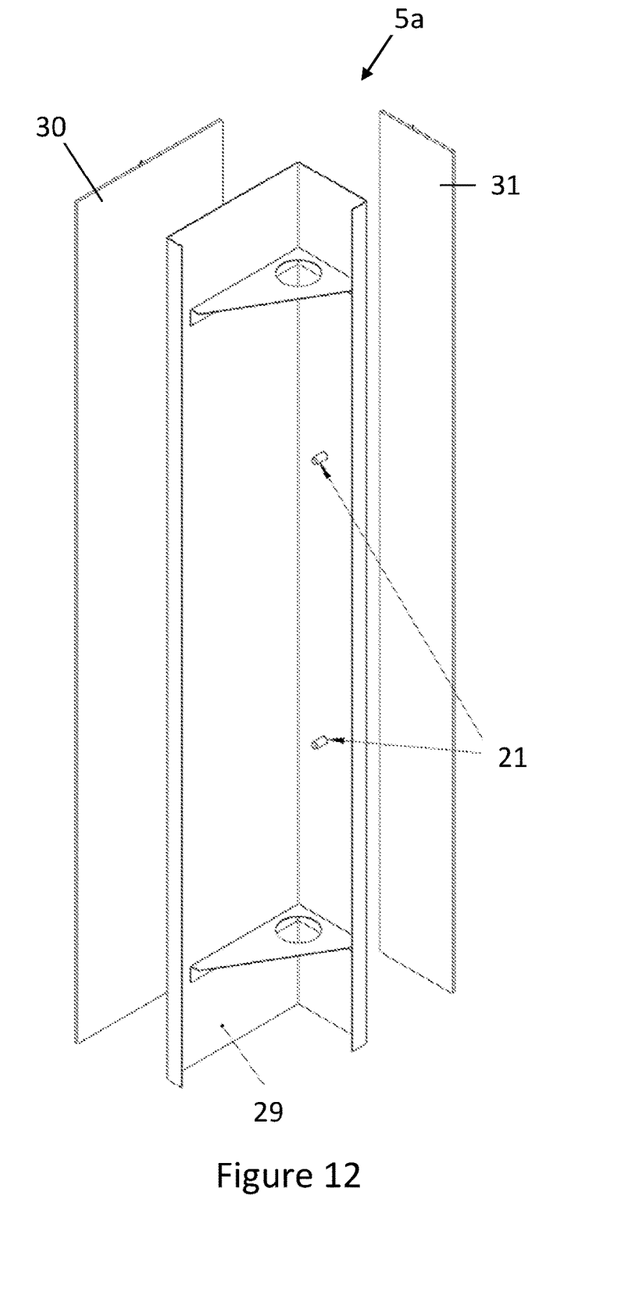
FIG. 12 corresponds to FIG. 11, but shows separately the components of the corner decorative panel of FIG. 11.

FIG. 11 illustrates one of the corner decorative panels 5a of FIG. 1. As shown in FIG. 12 this again comprises a steel backing member 29, to the outward faces of which are secured appropriate aluminum panels 30 and 31. The backing member again has location pins 21 which engage in location holes 19 in respective magnetic fixings 16.

A media wall, (together with a method by which that media wall is constructed), has been described above by way of example only with reference to the embodiment disclosed in the drawings. It will be appreciated that the components in that embodiment may be combined with identical components or similar components to provide a media wall of any desired size and having a desired size of display. It will also be appreciated that many modifications can be made without departing from the scope of the present invention, as recited in the following claims.

The invention claimed is:

1. A media wall comprising:
  a vertical frame arranged to be anchored to one or more of a floor, wall or ceiling, the vertical frame comprising a plurality of uprights;
  a plurality of display panel cross members fixed to the plurality of uprights;
  one or more display panels supported by the plurality of display panel cross members;
  a plurality of decorative panel cross members fixed to the plurality of uprights; and
  a plurality of decorative panels supported by the plurality of decorative panel cross members;
  wherein the plurality of decorative panel cross members are different in type to the plurality of display panel cross members; each decorative panel of the plurality of decorative panels comprises a ferromagnetic rear face and decorative front face; each decorative panel cross member of the plurality of decorative panel cross members is extruded, and has a first end, a second end, and a number of channels each extending from the first end to the second end; the media wall further comprising a plurality of fixings arranged to engage in appropriate ones of the number of channels and to slide along the respective channels to a desired location; and each fixing of the plurality of fixings comprises a magnet arranged to engage with a respective ferromagnetic rear face of one decorative panel of the plurality of decorative panels.

2. The media wall of claim 1, wherein each and every upright of the plurality of uprights is arranged in a single linear array of uprights.

3. The media wall of claim 2, wherein the uprights of the plurality of uprights are all equally spaced within the single linear array.

4. The media wall of claim 1, wherein the plurality of uprights alone support all of the one of more display panels and the plurality of decorative panels.

5. The media wall of claim 1, wherein each decorative panel has at least one first location device and each fixing has at least one second location device arranged to engage with the at least one first location device to correctly locate the decorative panel associated with the at least one first location device.

6. The media wall of claim 1, wherein each decorative panel of the plurality of decorative panels comprises a rear ferromagnetic tray-like backing member comprising a forward planar section with three or more edges extending rearward to increase the rigidity of the forward planar section, each decorative panel further comprising a decorative facing member bonded or adhered to a front face of the forward planar section.

7. The media wall of claim 6, wherein each decorative panel of the plurality of decorative panels is rectangular and each rear ferromagnetic tray-like backing member has no more than three edges extending rearward from the forward planar section, with a first rearward extending edge joining both a second rearward extending edge and a third rearward extending edge and extending rearwards to a maximum extent along its length, with the second and third rearward extending edges extending rearward to a maximum extent where the second and third rearward extending edges join with the first rearward extending edge, the second and third rearward extending edges tapering off towards an edge of the rear ferromagnetic tray-like backing member opposite to the first rearward extending edge.

8. The media wall of claim 6, wherein the decorative facing members are non-ferromagnetic.

9. The media wall as claimed in of claim 8, wherein each decorative facing member embodies a planar aluminum panel that extends over an entirety of a respective forward planar section of a respective rear ferromagnetic tray-like backing member.

10. The media wall of claim 6, wherein the decorative facing members are of a lighter color than the rear ferromagnetic tray-like backing members.

11. The media wall of claim 6, wherein the one or more display panels and the plurality of decorative panels cover an entire external face or entire external faces of the media wall.

12. The media wall of claim 11, wherein each decorative panel of the plurality of decorative panels is secured in place by magnets and is configured to be removed without the use of tools.

13. The media wall of claim 1, wherein the plurality of decorative panels comprises a plurality of identical decorative panels that are interchangeable on the vertical frame.

14. The media wall of claim 13, wherein each decorative panel of the plurality of decorative panels has a width and height, each display panel of the one or more display panels has a width and a height, and the width of each display panel is an integer multiple of the width of each decorative panel of the plurality of decorative panels.

15. The media wall of claim 1, wherein the plurality of decorative panels comprises a plurality of planar decorative panels and a plurality of decorative corner panels, each decorative corner panel of the plurality of decorative corner panels forms both part of a front face of the media wall and a return edge of the media wall, and the return edge encloses a side of the media wall.

16. A method of constructing a media wall as claimed in claim 1, the method comprising, in no particular order, the steps of:
  selecting the one or more display panels;
  selecting the plurality of decorative panels;
  selecting or cutting the plurality of display panel cross members of an appropriate length for the selected one or more display panels;

selecting or cutting the plurality of uprights of an appropriate length;
selecting or cutting the plurality of decorative panel cross members of an appropriate length;
securing the plurality of uprights in position in a building as a single linear array;
mounting the plurality of display panel cross members to the plurality of uprights to form a frame supported entirely by the plurality of uprights;
mounting the one or more display panels centrally in the frame on the plurality of display panel cross members;
securing the plurality of decorative panel cross members to the plurality of uprights;
selecting an appropriate number of magnetic fixings of a plurality of magnetic fixings and fixing the number of magnetic fixings in the number of channels in the plurality of decorative panel cross members; and
securing the plurality of decorative panels to one or more magnetic fixings of the plurality of the magnetic fixings.

17. The method of claim 16, further comprising securing a plurality of identical decorative panels on a front face of the media wall by means of a plurality of identical magnetic fixings of the plurality of magnetic fixings, and securing a plurality of identical corner decorative panels by means of other magnetic fixings of the plurality of magnetic fixings identical to the plurality of identical magnetic fixings securing the plurality of identical decorative panels on the front face.

* * * * *